United States Patent [19]

Takeshima

[11] Patent Number: 4,940,523
[45] Date of Patent: Jul. 10, 1990

[54] PROCESS AND APPARATUS FOR COATING FINE POWDERS

[75] Inventor: Eiki Takeshima, Chiba, Japan
[73] Assignee: Nisshin Steel Company Ltd., Tokyo, Japan
[21] Appl. No.: 359,116
[22] Filed: May 31, 1989

[30] Foreign Application Priority Data

Jun. 9, 1988 [JP] Japan .................. 63-140636
Mar. 27, 1989 [JP] Japan .................. 1-74770

[51] Int. Cl.$^5$ ................................. C23C 14/34
[52] U.S. Cl. .................. 204/192.12; 204/192.15; 204/192.16; 204/192.22; 204/192.23; 204/192.14; 204/298.02; 204/298.07; 204/298.28; 204/298.23
[58] Field of Search ............ 204/192.12, 192.14, 204/192.15, 192.16, 192.22, 192.23, 298 C, 298 GF, 298 SC, 298 SM, 298 MR

[56] References Cited

U.S. PATENT DOCUMENTS 4,080,281 3/1978 Endo ........................ 204/298
4,302,311 11/1981 Lowe et al. ................ 204/192.13

FOREIGN PATENT DOCUMENTS 2441448 3/1975 Fed. Rep. of Germany ...... 204/298 SC
62-250172 10/1987 Japan ...................... 204/298 SC Primary Examiner—Aaron Weisstuch
Attorney, Agent, or Firm—Webb, Burden, Ziesenheim & Webb

[57] ABSTRACT

There is disclosed a process for coating fine powder of a metal, a ceramic, a plastic or an organic pigment with a metal or a ceramic comprising: (a) dispersing particles of said fine powder into primary particles by fluid jet mill treatment in an inert atmosphere; (b) heating the dispersed fine powder in an inert atmosphere under reduced pressure; (c) placing the heated powder in an evacuable rotary barrel sputtering chamber, forming a fluidized bed by rotating the barrel at a low speed and coating said fluidized powder by sputtering as the barrel is being rotated. By this process, fine powders of metals, ceramics and plastics having a particle diameter of 0.1–10 μm can be uniformly coated by a metal or a ceramic. There is also provided an apparatus therefor.

11 Claims, 1 Drawing Sheet

PROCESS AND APPARATUS FOR COATING FINE POWDERS

FIELD OF THE INVENTION

This invention relates to surface coating of particles of fine powder of metals, ceramics, plastics or organic pigments having a particle diameter of 0.1 μm to 10 μm with various kinds of metals or ceramics by means of sputtering.

BACKGROUND OF THE INVENTION

Powders of metals, ceramics, plastics, etc. having particle diameters of several μm or larger which are coated with a certain metal by electroless plating, chemical replacement plating based on ionization series, CVD, etc. are used for catalysts, ornaments, powder metallurgy, dispersed reinforcing particles for composite materials, materials which provide electromagnetic shielding materials with electric conductivity, etc. Powders used for such purposes should preferably be as small as possible because the specific surface area of a powder increases with decreasing particle size and thus powders of smaller particle sizes have better sintering properties, reactivity, etc. Therefore, development of techniques by which fine particles of smaller diameter can be coated with a wider range of materials is strongly desired.

JP-A 56-130469(1981) discloses a process for preparing powders coated with a noble metal which have the same appearance as said noble metal and can be used for ornaments, said process comprising coating a fine powder of glass, a ceramic or a plastic which has a diameter of not smaller than 50 μm with a noble metal by sputtering as the powder is being cascaded on an inclined surface.

However, it is believed to be extremely difficult to firmly and uniformly coat fine particles smaller than 10 μm with a metal or a ceramic by the conventional processes mentioned above or by PVD process such as sputtering, ion plating, etc, and successful coating of this type has not been reported. The difficulty arises because fine powders with particle diameter smaller than 10 μm exhibit strong aggregation and thus easily form secondary particles, and may adsorb moisture and various gases.

Under the circumstances, the inventor disclosed in JP-A 62-250172(1987), a process for coating ultrafine powder of a metal, a ceramic or a plastic whose primary particles have an average particle diameter of 100 Å to 1 μm with a metal, a ceramic or a plastic, said process comprising:
  (a) dispersing the particles of said powder into primary particles by fluid-jet-milling in an inert atmosphere and carrying the particles by an inert gas;
  (b) heating the dispersed ultrafine powder in a heating zone of an inert atmosphere under a reduced pressure;
  (c) dropping the powder in a sputtering chamber provided with vertical targets so as to fall in the direction parallel with said targets and thus coating said powder with a metal, a ceramic or a plastic by sputtering; and
  (d) repeating the procedures of the above (a), (b) and (c).

However, it was discovered that the process involves the following problems:

(1) It takes a long time to uniformly coat each particle of a fine powder having a particle size of 0.1 μm to 10 μm by sputtering since the powder has a vast surface area. It was further found that the sputtering time is determined by the free falling velocity of the falling particles in the sputtering chamber (vacuum) while the sputtering (coating) proceeds at almost the same speed as in the atmosphere. Because of this, it is often difficult to uniformly coat heavy metal powders particle by particle.
  (2) In the case of light powders, it was found that powder particles diffuse during free falling in the sputtering chamber and some of the powders tend to adhere to the targets and hinder the normal sputtering.

This invention is intended to solve the above problems and provide a sputtering process and apparatus for coating the surface of primary particles of a diameter of 0.1 μm to 10 μm firmly and uniformly with a metal or a ceramic.

DISCLOSURE OF THE INVENTION

This invention provides a process for coating fine powder of a metal, a ceramic, a plastic or an organic pigment with a metal or a ceramic comprising:
  (a) dispersing particles of said fine powder into primary particles by fluid jet mill treatment in an inert atmosphere;
  (b) heating the dispersed fine powder in an inert atmosphere under reduced pressure;
  (c) placing the heated powder in a rotary barrel sputtering chamber, forming a fluidized bed by rotating the barrel at a low speed, and coating said fluidized powder by sputtering as the barrel is being rotated.

This invention also provides an apparatus for coating fine powder comprising:
  (1) a sputtering chamber comprising an evacuable rotary barrel supported by two separate rotation shafts, wherein a sputtering source or sources are supported by the first rotation shaft, and the second rotation shaft functions as a conduit for introducing fine powder to be coated and taking out coated fine powder;
  (2) a fluid jet mill means communicating with the sputtering chamber via a conduit provided with a valve and the second rotation shaft which functions as a conduit for taking out coated powder;
  (3) an evacuable heat-treating vessel communicating with said fluid jet mill means via a conduit provided with a valve; and
  (4) a powder-introducing conduit provided with a valve which communicates said heat-treating vessel and said second rotation shaft.

In the process of the present invention, the core particles can be fine powders of metals such as iron, copper, silver, gold, tin, platinum, nickel, titanium, cobalt, chromium, aluminum, zinc, tungsten and alloys or intermetallic compounds thereof, which are produced by atomizing, electrolysis, mechanical pulverization, chemical reduction, vaporization in a low pressure gas, active hydrogen-molten metal reaction, chloride reaction, etc. These metals also can be used as coating materials in sputtering.

The core particles can also be fine powders of ceramics, specifically for instance, fine powders of metal oxides such as metal oxides, $Al_2O_3$, $Cr_2O_3$, ZnO, $GeO_2$, $TiO_2$, $Y_2O_3$, $MoO_2$, $SiO_2$, PbO, $ZrO_2$, $WO_3$, $Fe_2O_3$, $BaTiO_3$, $Ta_2O_5$, soft ferrite, partially stabilized zirconia, etc.; metal carbides such as $SiC$, $Cr_3C_2$, $WC$, $TiC$, $B_4C$, $ZrC$, $MoC$, $Fe_3C$, $TaC$, $Co_3C$, $Ni_3C$, $NbC$, etc.; graphite, carbon black, etc.; nitrides such as $Bi_3N_4$, $BN$, $TiN$, $AlN$, $ZrN$, $TaN$, $CrN$, $W_2N$, $NbN$, $TiCN$, etc.; borides such as $CrB_2$, $ZrB_2$, $Fe_2B$, $Ni_2B$, $AlB_2$, $CaB_2$, $Mo_2B$, etc.; sulfides such as $CdS$, $Cu_2S$, $MoS_2$, $TaS_2$, $SrS$, etc.; phosphides, silicides, carbonitrides and hydroxides as well as natural or synthesized mineral materials such as cordierite, zeolite, cerisite, mica, etc. Most of these materials can also be used as coating materials in sputtering.

The core particles can further be fine powders of plastics such as polyolefin resin, polyamide resin, vinyl chloride resin, acrylic resin, methacrylic resin, chlorotrifluoro-ethylene resin, acrylonitrile resin, silicone resin, vinylidene fluoride resin, epoxy resin, phenol resin, urea resin, urethane resin, polyester resin and copolymers thereof prepared by emulsion polymerization, suspension polymerization, soapless polymerization, non-acqueous dispersion polymerization, etc. as well as organic pigments.

The shape of the core particles can be spherical, acicular, cylindrical, rod-like, cubic, planar, irregular, cluster, whisker-like, hollow, porous, etc.

The powders of metals, ceramics or plastics which have been dispersed into primary particles in the dry state are prepared preferably by means of a fluid jet mill which comprises a percussion board and uses an ultrasonic gas stream.

The thickness of the film formed by the sputtering should be 10 Å to 1 μm, preferably 100 Å to 1000 Å. If the thickness is too small, the characteristics of the coating film are not manifested. If the thickness is too large, production cost will rise.

The barrel type sputtering chamber is rotated at 0.1 to 10 r.p.m. When the rotation speed is in excess of 10 r.p.m., it is hard to form a dense film, since the coating material deposits in the form of fine powder. When it is below 0.1 r.p.m., a uniform film cannot be formed on the particles.

In the present invention, a plurality of targets can be provided in a sputtering chamber and two or more layers of coatings can be formed by repeating sputtering with different materials. Further it is possible to alloy the plurality of coating layers by heating the coated particles for diffusion. When fine powders are coated with an oxide, nitride or carbide, it is possible to form a multilayer coating consisting of varied concentrations of oxygen, nitrogen or carbon by changing the atmosphere of the sputtering chamber.

It is also possible to further form a coating layer or layers of different materials on the coating formed in accordance with the process of the present invention by electroless plating, chemical replacement reaction based on ionization series, CVD process, etc.

For the process of the present invention, there can be used any of various sputtering apparatuses such as diode sputtering apparatus, magnetron sputtering apparatus, high frequency sputtering apparatus, reactive sputtering apparatus and other known sputtering apparatuses.

It is preferable that the apparatus used for the present invention be provided with sputtering targets which are movable so that the distance between the targets and the uniform fluidized bed of particles which is formed at the bottom of the barrel can be regulated.

The fine powder coated by sputtering is carried to a fluid jet mill by introducing an inert gas into the sputtering chamber after closing the communication between the evacuable heat-treating vessel and the barrel type sputtering apparatus. Thus the coated fine powder is rapidly and completely transferred to the fluid jet mill in accordance with the principle of a vacuum cleaner.

Now the invention is specifically described by way of working examples with reference to the attached drawings

BRIEF EXPLANATION OF THE ATTACHED DRAWINGS

SPECIFIC DESCRIPTION OF THE INVENTION

Figure 1:
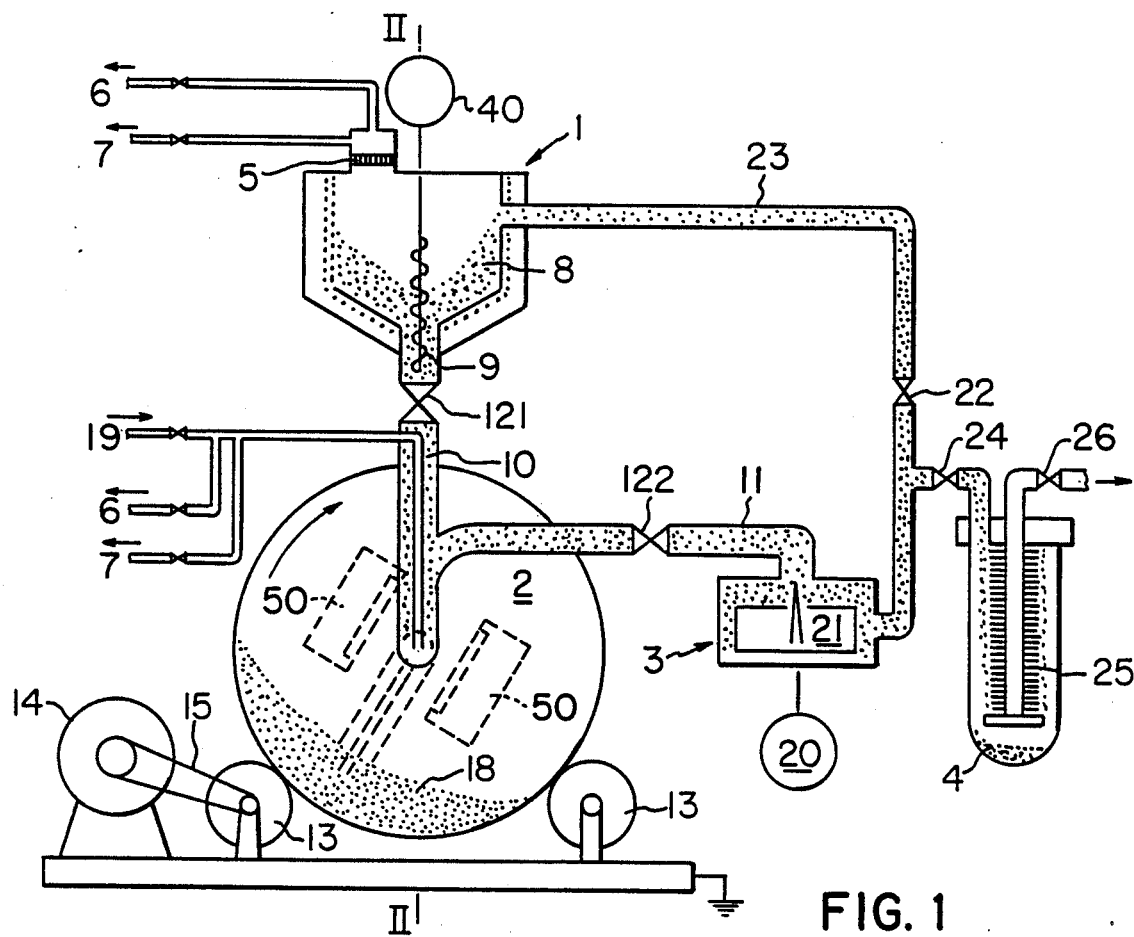
FIG. 1 is a schematic side view showing the construction of an apparatus in accordance with the present invention in which pertinent parts are shown in cross section.
Figure 2:
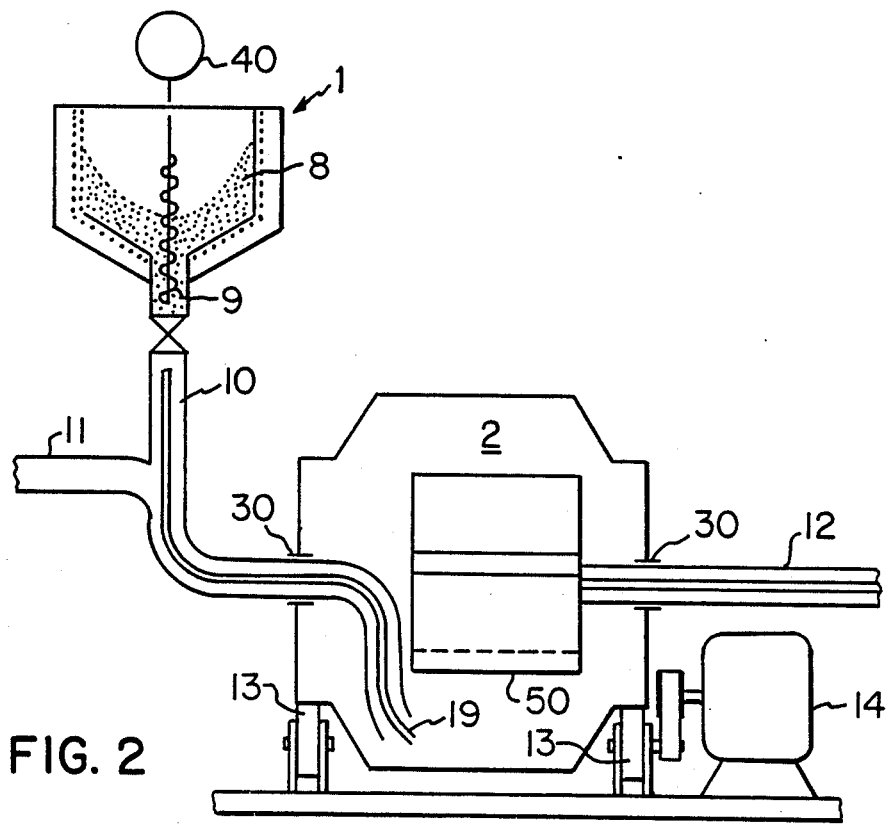
FIG. 2 is an elevational cross section of the apparatus shown in FIG. 1 along the line II-II viewed in the direction generally at 90° from the direction of FIG. 1.

The pertinent parts of the apparatus comprises a heat-treating vessel 1, a rotatable barrel type sputtering chamber 2, a fluid jet mill 3 and a powder filter 4.

The heat-treating vessel 1 is an evacuable and ohmically heatable container and is communicated with a main vacuum system 6 and a high vacuum system 7 via a filter 5. The main vacuum system is a mechanical vacuum pump and the high vacuum system is a combination of a cryosorption pump, a turbomolecular pump or a mechanical booster pump or the like and a chilling trap. The evacuable heat-treating vessel 1 is provided with a screw feeder 9, which feeds heat-treated fine powder 8 into a conduit 10, which is provided with a valve 121 and leads to the rotatable barrel type sputtering chamber 2, and a motor 40, which drives the screw feeder 9.

The sputtering chamber 2 (hereinafter occasionally simply called "barrel") is a rotatable cylindrical body having a structure like that of a roller mill and communicates with the heat-treating vessel 1 and tubes 6 and 7 of the vacuum system. One side wall thereof is rotatably supported by a horizontal portion of the above-mentioned conduit 10, which first extends downward and bends into the horizontal direction with a great radius of curvature. A magnetic seal 30 is provided at the bearing in order to keep the system in vacuum. A stock charge port is provided at a suitable position of the barrel.

The other side wall of the barrel 2 is rotatably supported by a shaft 12 with the same type of bearing mechanism 30. At the end of the shaft, sputtering sources 50 are mounted in a confronting relation. The orientation thereof is not vertical but tilted so as to correspond to the position of the fluidized bed of powder to be formed at the bottom of the barrel as explained later.

The sputtering sources are operated by high frequency electric current supplied from an electric source not shown through cables which extend in the rotation shaft 12.

The sputtering chamber 2 is communicated with the evacuable heat-treating vessel 1 via the fluid jet mill 3 and the connecting conduit 23 which is provided with valves 22.

The conduit 10, after it bends into the horizontal direction to work as a rotation shaft, again bends downward to reach the bottom portion of the barrel. The downward bending is not vertical but is toward the position where the fluidized bed of powder is formed.

The sputtering chamber 2 is supported by supporting rollers 13 and rotated by means of a motor 14 and belt 15. The conduits 10 and 11 and the tube 19 communicating with the vacuum system, etc. are made of graphite which is not easily coated by sputtering.

The sputtering sources 50, a dipole magnetron in this embodiment, are supported at the end of the shaft 12 and the position thereof, that is, the distance from the fluidized bed of fine powder 18, can be regulated by a screw mechanism not shown. The side walls of the barrel can be removed when the apparatus is not operated and such regulation is performed during suspension of operation.

The fine powder coated by sputtering is carried to the fluid jet mill 3 by closing valve 121, evacuating the evacuable heat-treating vessel 1 and then opening the valve 122 as an inert gas is slowly introduced through an inert gas introducing tube 19. The fluid jet mill 3 is of such a structure that the fine powder entrained by the inert gas collides with a propeller 21 which is rotated at a high speed by a motor 20.

The powder circulation conduit 23 is connected to the powder filter 4 via a branch tube provided with a valve 24. The powder filter 4 is a trap comprising a cylindrical filter 25 and communicating with an evacuation system 26.

An apparatus was fabricated by Kabushiki Kaisha San'ei Riken on the basis of the inventors' design. The apparatus had approximately the following dimensions. Evacuable heat-treating vessel: 300 mm in diameter and 150 mm in height. Rotatable barrel type sputtering chamber: 500 mm in diameter and 300 mm in generating line length.

The sputtering source used was "1500D" manufactured by Tokyo High Power Kabushiki Kaisha and the fluid jet mill used was "DA-3" manufactured by Sankyo Dengyo K.K.

The apparatus can be provided with a built-in microcomputer which enables the above-described procedures to be automatically controlled in sequence.

Fine powder of α-alumina was coated with aluminum using this apparatus. Five-hundred (500) grams of a commercially available fine powder of α-alumina having an average particle diameter of 0.1 μm (supplied by Sumitomo Chemical Industries, Ltd.) was placed in the rotatable barrel type sputtering chamber and the evacuable heat-treating apparatus was evacuated to $2\times10^{-2}$ Torr. Argon gas was slowly introduced into the apparatus through the inert gas-introducing tube 19. Simultaneously, the fluid jet mill was operated to disperse the fine powder into primary particles and thereafter the powder was collected in the evacuable heat-treating vessel 1. The powder was heated and degassed at 200° C. under a pressure of $2\times10^{-2}$ Torr for 30 min. Then the powder was transferred to the rotatable barrel type sputtering chamber the inside space of which was evacuated after the air in it had been replaced with argon. The rotatable barrel type sputtering chamber was rotated at 5 r.p.m. and sputtering was started by the dipole magnetron (3 KW×2, 13.56 MHz). After 1 hour, the powder had been coated with aluminum to a thickness of 10 Å. Then sputtering was discontinued. The powder was further subjected to sputtering for another hour after the powder was dispersed by the fluid jet mill and heated and degassed as described above. The cycle was repeated 10 times and a 100 Å thick aluminum coating was achieved. This repeated operation was automatically carried out by a control system including a microcomputer.

After the sputtering operation, argon gas was introduced into the rotatable barrel type sputtering chamber, the argon gas entraining the coated fine powder was transferred to the powder filter 4 and coated α-alumina powder was collected.

The coated fine powder obtained by the above-described operation was found to consist of α-alumina particles having an average diameter of 0.2 μm coated with a generally uniformly formed aluminum layer having a thickness of 100 Å.

Using this apparatus various powders were coated in Examples 2–10 as indicated in Table 1. The thus obtained powders can be used as powder materials for sintered cutting tools, heaters for vacuum apparatuses, grinders, electroconductive fillers, cosmetic powders, fillers for FRM, thermally conductive base plates for IC's, colored toners for color copying, refractory bricks, etc., by shaping and sintering in accordance with ordinarily employed methods, if necessary.

TABLE 1

| Example | Powder | Av. Particle size (μm) | Coating Materials | Av. film thickness (Å) |
|---|---|---|---|---|
| 2 | Titanium carbonitride | (3.0) | Chromium | (200) |
| 3 | Tungsten | (3.0) | Platinum | (500) |
| 4 | Diamond | (10.0) | Titanium carbide | (100) |
| 5 | Silica beads | (10.0) | Gold | (50) |
| 6 | Nylon resin | (10.0) | Gold | (20) |
| 7 | Silicon carbide whisker | (5.0) | Aluminum | (50) |
| 8 | Aluminum nitride | (5.0) | Yttrium oxide | (10) |
| 9 | Cu phthalocyanine blue | (1.0) | Titanium oxide | (50) |
| 10 | Magnesium oxide | (10.0) | Nickel/Aluminum | (1000/1000) |

What is claimed is:

1. A process for coating fine powder of a metal, a ceramic, a plastic or an organic pigment with a metal or a ceramic comprising:
   (a) dispersing particles of said fine powder into primary particles by fluid jet mill treatment in an inert atmosphere;
   (b) heating the dispersed fine powder in a heating zone of an inert atmosphere under reduced pressure;
   (c) placing the heated powder in a rotary barrel sputtering chamber, forming a fluidized bed by rotating the barrel at a low speed, and coating said fluidized powder by sputtering as the barrel is being rotated.

2. The process as recited in claim 1, wherein the particles are taken out of said heating zone and transferred to the rotary sputtering chamber by introduction of an inert gas into said heating zone and evacuation of said sputtering chamber and the coated particles transferred into the fluid jet mill means and a filtration means in the same manner.

3. The process as recited in claim 1 or 2, wherein the fine powder to be coated comprises primary particles having an average particle size of 0.1–10 μm.

4. The process as recited in claim 3, wherein the coating material is one selected from the class consisting of aluminum, chromium, platinum, titanium carbide, gold, yttrium oxide, titanium oxide and nickel-aluminum alloy.

5. The process as recited in claim 1, wherein the fine powder to be coated is one selected from the class consisting of alumina, titanium carbonitride, tungsten, diamond, silica beads, Nylon resin, silicon carbide whisker, aluminum nitride, copper phthalocyanine blue and magnesium oxide.

6. An apparatus for coating fine powder, comprising:
(1) a sputtering chamber comprising an evacuable rotary barrel supported by first and second rotation shafts, wherein a sputtering source or sources supported by the first rotation shaft are provided, and the second rotation shaft functions as a conduit for introducing fine powder to be coated and taking out coated fine powder;
(2) a fluid jet mill means communicating with the sputtering chamber via the second rotation shaft which functions as a conduit for taking out coated powder and is provided with a valve;
(3) an evacuable heat-treating vessel communicating with said fluid jet mill means via a conduit provided with a valve;
(4) a powder-introducing conduit provided with a valve which communicates said heat-treating vessel and said first rotation shaft.

7. The apparatus as recited in claim 6 wherein the evacuable heat-treating vessel is provided with a screw feeder which transfers fine powder to the powder introducing conduit.

8. The apparatus as recited in claim 6, wherein the evacuable heat-treating vessel and the sputtering chamber are communicated with a main evacuation system and a high degree evacuation system.

9. The apparatus as recited in claim 6, wherein the rotary sputtering chamber communicates with a main evacuation system and a high degree evacuation system and is provided with a tube for introducing an inert gas.

10. The apparatus as recited in claim 9, wherein tubes communicating with the main evacuation system and the high degree evacuation system and the inert gas introducing tube are united into a tube which is located in the powder-introducing conduit which works as a rotation shaft for the rotary sputtering chamber.

11. The apparatus as recited in claim 6, wherein a branch conduit having a valve is provided in the conduit which communicates the fluid jet mill means and the evacuable heat-treating vessel on the heat-treating vessel side of the valve thereof, said branch conduit communicating with a filter means, which collects the coated powder.

* * * * *